United States Patent [19]

Koga et al.

[11] Patent Number: 5,227,268
[45] Date of Patent: Jul. 13, 1993

[54] X-RAY MASK AND ITS FABRICATING METHOD-COMPRISING A FIRST AND SECOND ALIGNMENT PATTERN

[75] Inventors: Keisuke Koga, Tsukuba; Juro Yasui, Toyonaka, both of Japan

[73] Assignee: Matsushita Electric Industrial Co., Ltd., Osaka, Japan

[21] Appl. No.: 775,215

[22] Filed: Oct. 11, 1991

[30] Foreign Application Priority Data

Oct. 17, 1990 [JP] Japan .................................. 2-280354

[51] Int. Cl.$^5$ .............................................. G21K 5/00
[52] U.S. Cl. ........................................ 430/5; 430/311;
378/34; 378/35
[58] Field of Search .................. 430/5, 311, 395, 396;
378/35, 34

[56] References Cited

U.S. PATENT DOCUMENTS 4,887,283 12/1989 Hosono ................................... 430/5

Primary Examiner—Marion E. McCamish
Assistant Examiner—S. Rosasco
Attorney, Agent, or Firm—Ratner & Prestia

[57] ABSTRACT

An object of the sub- invention is to offer a X-ray mask capable of providing sufficiently strong alignment signal and to improve alignment accuracy. The X ray mask of the subject invention becomes the circuitry pattern and the alignment pattern on one main surface of the X-ray permeable film. Since the structure is also provided with a X-ray absorbant pattern, and this structure enables the laser beam without attenuation to illuminate the alignment pattern formed on the other surface of the X-ray permeable film, and by further optimizing the height of the alignment marks, a sufficiently strong alignment signal is obtained.

4 Claims, 4 Drawing Sheets

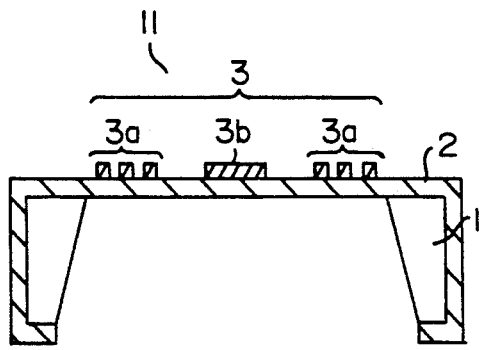
FIG. IA
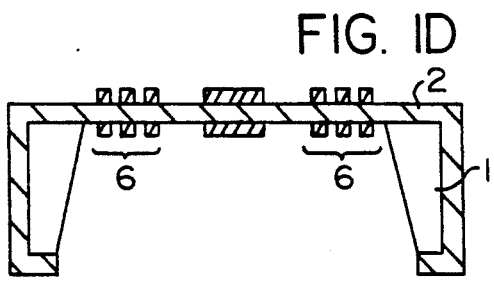
FIG. ID
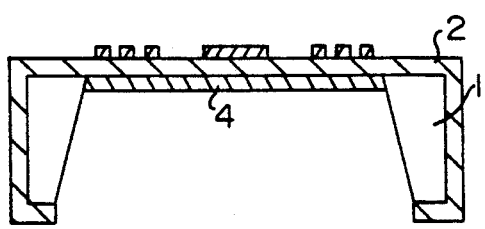
FIG. IB
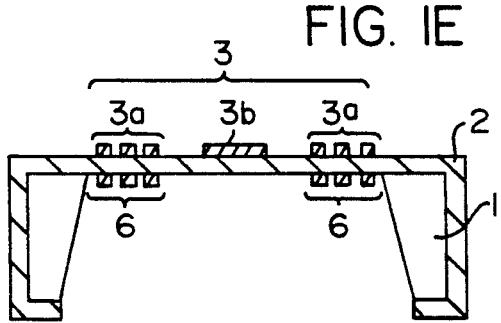
FIG. IE
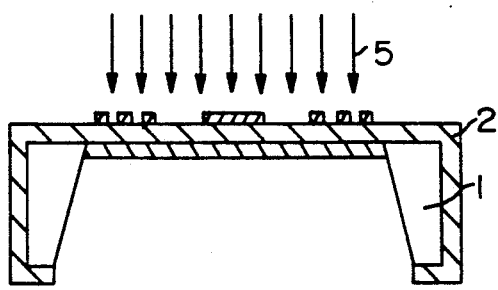
FIG. IC
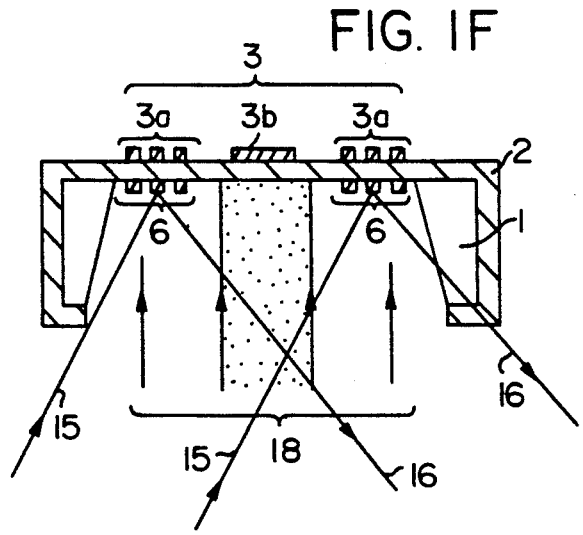
FIG. IF

X-RAY MASK AND ITS FABRICATING METHOD-COMPRISING A FIRST AND SECOND ALIGNMENT PATTERN

BACKGROUND OF THE INVENTION

The subject invention relates to X-ray masks used in X-ray exposure apparatus.

In recent years while semiconductor devices' miniaturization and high integration advanced markedly, vigorous development in minute pattern formation technology have been taking place in the areas of production apparatus and production technology. In the field of developing lithography technology, the optical reduction projection technology, which so far had supported the mass production technology of LSIs, had markedly improved resolution through a shift to ultrashort wavelength light sources and efforts to achieve high NA, is reaching its limits in the half-micron region.

For the 0.25 micrometer level of the next generation exposure technology required for the generations of devices to follow the 256MDRAM, electron beam exposure technology or X-ray exposure technology are considered to be promising.

For X-ray exposure, X-ray masks formed by a combination of X-ray absorbing material and X-ray permeable material are necessary.

A cross-section of a prior art X-ray mask is shown in FIG. 4. In FIG. 4, 1 is the silicon support framework composed of a Si substrate, 2 is the silicon nitride (SiN) film used as the X-ray permeable film (membrane), 3 is the tantalum film used as the X-ray absorbing pattern, 3a is the alignment pattern and 3b is the circuitry pattern.

The circuitry pattern 3b of the X-ray mask 11 is formed on the reverse side of the SiN flim 2, vis-a-vis the X-ray source. Likewise, even in the prior art masks for silicon LSI lithography the circuitry pattern is formed on the reverse side of the mask. This is because the formation of the pattern on the reverse side permits the clean transfer of the mask pattern to the wafer when exposed. And, if the minute pattern were to be formed on the light source side of the mask the pattern would be blurred and not cleanly transferred to the wafer.

Further, since the alignment pattern 3a is formed simultaneously with the circuitry pattern 3b, the alignment pattern 3a is always on the same side of the X-ray permeable film with the circuitry pattern 3b and no thought was given in the prior art to forming the alignment pattern 3a and the circuitry pattern 3b on different sides.

Also, development has been under way on a combination of a silicon nitride film as the X-ray permeable film and a tungsten film as the X-ray absorbant pattern.

X-ray exposure devices, due to reasons such as materials for mirrors and lenses having sufficient capabilities in the soft X-ray wavelength region not having been developed to date (which prevents the realization of reduced projection systems), are using proximity exposure methods which hold the X-ray mask and wafer in parallel with a minute gap between them during exposure.

On the other hand, when forming minute patterns on the 0.25 micrometer level, a high accuracy alignment of 0.1 micrometer or better between the X-ray mask and the wafer is required. For this purpose methods calling for continued high accuracy alignment even during exposure have been adopted.

FIG. 5 shows a typical alignment structure during proximity gap exposure. In FIG. 5, 11 is the X-ray mask shown in FIG. 4, 13 is the highly accurate wafer stage, 14 is the alignment optical system, 15 is the laser beam, 16 is the diffracted beam, 17 is a photodetector, and 18 is the X-rays. The alignment optical system 14 and the photodetector 17 are located outside the exposing X-ray 18's region in order for alignment detection to be possible even during X-ray exposure. After the X-ray mask 11 and wafer 12 are placed oppositely in close proximity, laser beam 15 for detecting alignment is shined over the X-ray mask 11 and alignment marks formed over the wafer 12. The diffracted beam 16, diffracted by the alignment marks, contains the relative alignment slippage data between the X-ray mask 11 and the wafer 12. A highly accurate alignment is achieved by feeding back to the wafer stage 13 the relative alignment slippage data between the X-ray mask 11 and the wafer 12, obtained from the signal detected by the photodetector 17, and correcting the stage position.

We shall explain this in further detail, using FIG. 6.

When aligning the X-ray mask 11 and the semiconductor wafer 12, the method of illuminating with laser beam 15, which is the alignment beam, the grid-shaped alignment marks respectively formed on the X-ray mask 11 and the wafer 12 and comparing each diffracted beam as a method for detecting the amount slippage between the two, is used as one of the most accurate methods (Optical Technology Contact, Vol. 28, No. 7, P. 3 (1990).) This method shall be explained in further detail.

In FIG. 6, the laser beam 15 illuminates X-ray mask 11's gridshaped alignment marks 26, and, of the diffracted beam thus formed, the first order reflected diffracted beam 16 is detected by the photodetector 17. On the other hand, the first order reflected diffracted beam 16a generated by the laser beam which passed through the X-ray mask 11 and illuminated the grid-shaped alignment marks 26a of the wafer 12 are similarly detected by another photodetector 17.

By comparing the diffracted beams 16 and 16a, thus detected, the alignment slippage between the X-ray mask 11 and the semiconductor wafer 12 is detected.

As elements affecting the alignment accuracy, we can cite such items as accuracy in determining the stage position and accuracy of detecting the alignment signal; the alignment signal strength (S/N) in the latter is a vital element.

In accordance with the above prior art structure, in detecting the alignment signal by the photodetector 17, as shown in FIG. 7, the laser beam 15 makes a round trip through the X-ray permeable film having a permeability ratio of around 70% formed by the silicon nitride film 2 of the X-ray mask 11, the strength of the diffracted beam 16 is reduced to around 50%. Moreover, the permeability ratio of the SiN film varies cyclically with its thickness, and, depending on the conditions, it is possible that the strength of the diffracted beam 16 will be decreased further.

Also, the diffraction efficiency of the alignment marks in this case is not dependent on the marks' shape but on the effective refraction ratio determined by the combination of the materials used in the X-ray permeable film and the X-ray absorbing pattern forming the X-ray mask 11, and usually becomes a small value so that it is not possible to freely set the optimum value.

Due to these reasons, the alignment signal strength became 1/5 or less of the ideal signal strength and had been a major obstacle to high accuracy alignment.

SUMMARY OF THE INVENTION

An object of the subject invention is to offer a X-ray mask capable of providing a sufficiently strong alignment signal and improved alignment accuracy.

The X-ray mask of the subject invention is provided with a circuitry pattern and a X-ray absorbant pattern which becomes an alignment pattern on one side of the X-ray permeable film. Also, the other surface of this X-ray permeable film is provided with alignment marks of the same pattern opposing the said alignment pattern. These alignment marks can be formed by equimultiple transfer via a self-adjustment method of the said alignment pattern.

In accordance with the structure of the subject invention a sufficiently strong alignment signal can be obtained since the laser beam illuminates the alignment marks formed on the said other surface of the X-ray permeable film without attenuation, and by selecting optimum height for the alignment marks.

BRIEF DESCRIPTION OF THE DRAWINGS

FIG. 1A through FIG. 1F are process cross section figures of a X-ray mask of one embodiment of the subject invention.

DETAILED DESCRIPTION OF THE INVENTION

Figure 2:
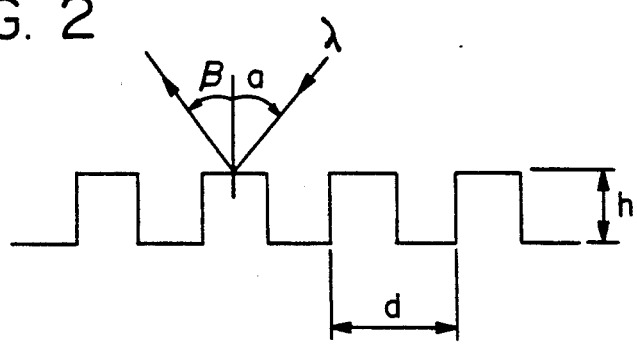
FIG. 2 is a cross-section figure of a lamella type diffraction grating.

The X-ray mask of the subject invention shall be explained, referring to the figures.

FIG. 1A through FIG. 1F are production process cross-section figures of the X-ray mask of one embodiment of the subject invention.

In FIG. 1A through FIG. 1F, 2 is the silicon nitride film, 3 is the tantalum film and 3a the first alignment pattern, while 6 are the alignment marks using photosensitive resin. The X-ray mask of the subject embodiment, as shown in its cross-section in FIG. 1E, has formed on the surface on the 2 micrometer thick SiN film 2, which is the X-ray permeable film, a circuitry pattern 3b and first alignment pattern 3a composed of 0.7 micrometer thick tantalum film which is the X-ray absorbant pattern. Further, via the SiN pattern 2, there are formed on the back surface of this SiN film 2 second alignment pattern 6 of photosensitive resin having the same pattern as and opposing the first alignment pattern 3a.

As against the prior art X-ray mask, by forming the second alignment pattern on the laser beam side as well, the laser beam emitted from the alignment optical system does not pass through the SiN film 2 but is directly diffracted by the second alignment pattern 6 so that the attentuation of the laser beam strength is quite small.

We shall now explain simply the method of manufacturing the X-ray mask of the subject embodiment, based on the manufacturing process cross-sections in FIG. 1A through FIG. 1F.

Figure 4:
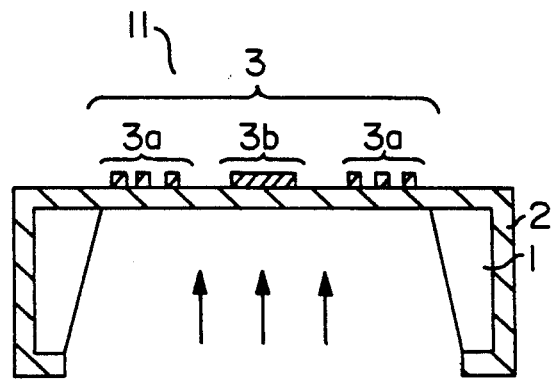
FIG. 4 is a cross-section figure of a prior art X-ray mask.
Figure 5:
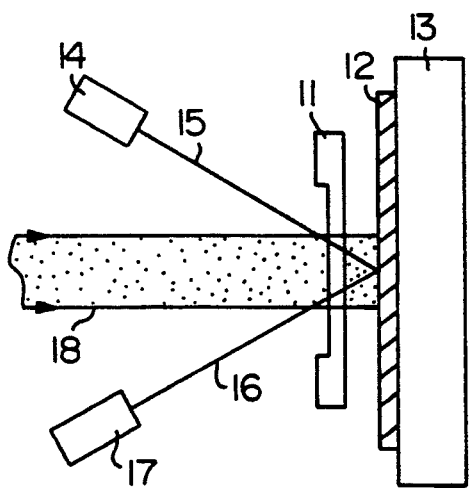
FIG. 5 is a figure used to explain the method of alignment during proximity gap exposure.
Figure 6:
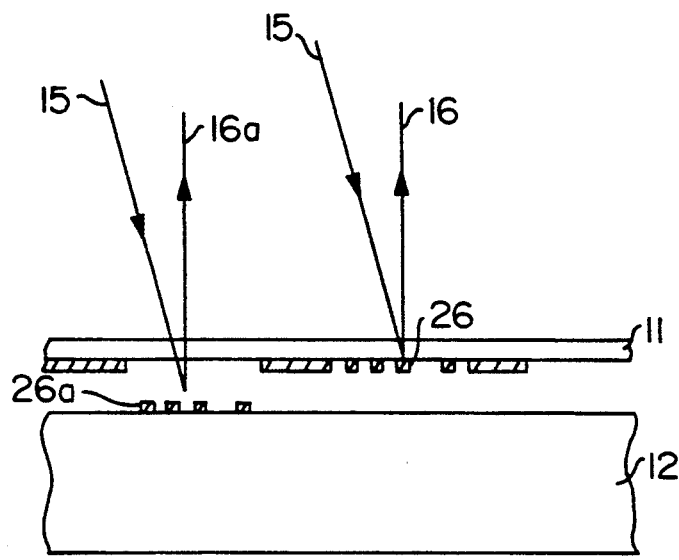
FIG. 6 is a figure used to explain the prior art alignment method using a diffracted beam.
Figure 7:
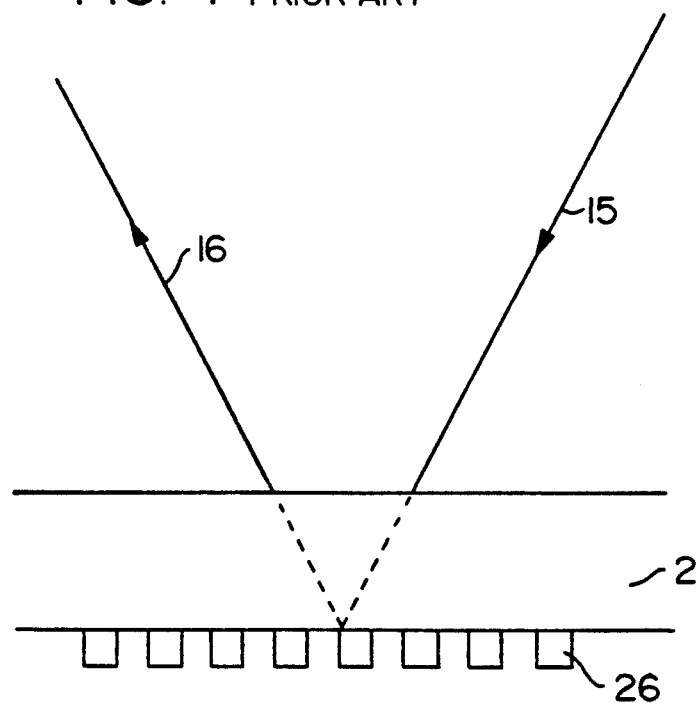
FIG. 7 is a figure to explain the beam path of the diffracted beam in the structure of FIG. 6.

As shown in FIG. 1A, a prior art X-ray mask 11 (FIG. 4) consisting of silicon support framework 1, the SiN film 2 (which is to become the X-ray permeable film) and the tantalum film 3 (which is to become the X-ray absorbant pattern) is formed. 3a is the prior art alignment pattern and 3b is the circuitry pattern.

Next, on the silicon nitride film 2 a uniform coat of photosensitive material 4 (positive photoresist, for instance) is deposited using a spinner, etc. At this time, the film thickness of the photosensitive material 4 is so set to maximize the diffraction efficiency which is governed by the structure of the alignment optical system. At this point, an explanation will be given for the setting of the thickness of the photosensitive material 4, referring to FIG. 2 and FIG. 3.

FIG. 2 is a cross-section figure of a lamella type diffraction grating.

As shown in FIG. 2, if the incoming laser beam's wavelength is $\lambda$, the incoming angle is $\alpha$, the diffraction angle is $\beta$, the pitch of the diffraction grating is d, and the height of the diffraction grating is h, the diffraction efficiency $\eta$ can be expressed by the following expression from the lamella diffraction grating's theory:

$$\eta = (400/m^2\pi^2) \cdot \cos^2[(\delta' + m\pi)/2]$$

Where, $\delta' = 2\pi h/\lambda (\cos\alpha + \cos\beta)$
$m\lambda = d(\sin\alpha - \sin\beta)$
and where m is the order of the diffracted beam.

The diffraction efficiency $\eta$ changes cyclically depending on the height h of the diffraction grating and has maximum and minimum values.

Figure 3:
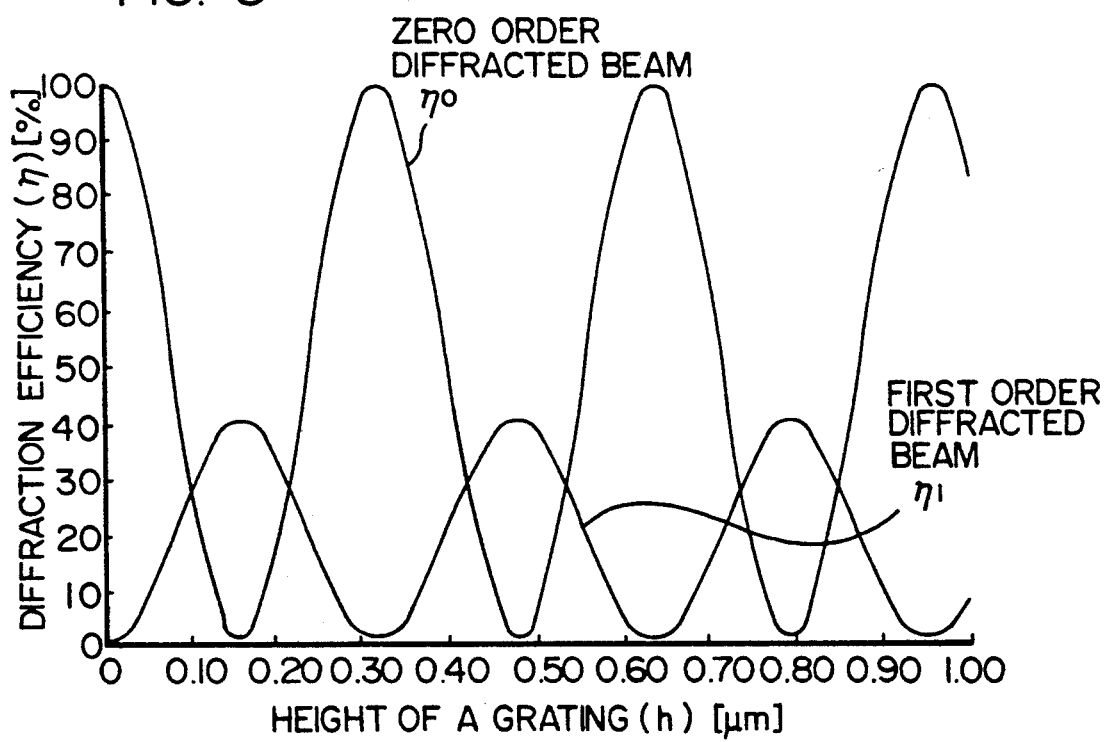
FIG. 3 shows the relationship between diffraction efficiency and the height of the diffraction grating.

FIG. 3 shows the relationship when a helium neon laser ($\lambda = 633$ nm) is used as the laser beam with a diffraction grating with pitch d = 4 micrometers and the incoming angle is set at approximately 10 degrees, between the diffraction efficiency $\eta$ of the zero order diffracted beam, the diffraction efficiency $\eta$ of the first order diffracted beam and the height h of the diffraction grating. Since the first order diffraction beam is usually used as the alignment beam, from FIG. 3 we can see that by setting the height h of the diffraction grating at 0.16 micrometer, 0.48 micrometer, etc., a maximum diffraction efficiency $\eta$ of approximately 40% is obtained. The height h of the diffraction grating thus obtained will be the film thickness of the photosensitive material 4.

In this manner the height of the diffraction grating can be freely selected to increase the diffraction efficiency, and, since alignment marks are formed on the laser beam side of the SiN film the attenuation of the alignment beam is small, and a sufficiently strong diffracted beam can be obtained.

Next, as shown in FIG. 1C, by using a light 5 to which the photosensitive material 4 is sensitive (for example, a light such as a mercury lamp) the entire surface is exposed at once using as the mask the tantalum film 3 which will be the X-ray absorbant pattern. Since the thickness of the silicon nitride film 2 which will be the X-ray permeable film is usually around 2 micrometers, the method becomes the same as contact exposure and the X-ray absorbant pattern will be accurately and equimultiply transferred to the photosensitive material 4 on the reverse side. Naturally, the first alignment pattern 3a composed of the first X-ray absorbant pattern will also be transferred without slippage in position.

In this way, a second alignment pattern 6 and a second LSI circuit pattern are transferred to the opposite positions corresponding to the first alignment pattern 3a and the first LSI circuit pattern 3b respectively as illustrated in FIG. 1D through a development process.

Then, before application of baking, another light exposure is applied to the unnecessary pattern of the second LSI circuit pattern only such that the second alignment pattern 6 is left, as illustrated in FIG. 1E, after development and baking.

As a matter of course, instead of going through development immediately after the first entire surface exposure performed from the first main surface side of the x-ray permeable film 2 and by going through development after an exposure from the second main surface side of the x-ray permeable film 2 with the second alignment pattern 6 being masked, the second alignment pattern 6 only can be transferred at a time as shown in FIG. 1E skipping the stage of FIG. 1D.

In this manner, according to the embodiment's X-ray mask, by using the second alignment pattern 6 as beam refracting beam elements, a sufficiently strong refracted beam is created when illuminated by the laser beam and accordingly a high resolution power can be obtained. That is to say, this X-ray mask would have second alignment pattern 6 having an optimized form to maximize the diffraction efficiency versus the alignment optical system. Thus a sufficient alignment signal strength is obtained, making possible the realization of a high alignment accuracy.

Also, the process of forming the second alignment pattern 6 can be done just by uniformly coating the photosensitive material 4 and by exposing the entire surface at once. This does not require specialized equipment and is very easy to accomplish. Moreover, in the transfer of the X-ray absorbant pattern, as it is the same in principle as contact exposure, the pattern position distortion accompanying the transfer of the X-ray absorbant pattern is at such a low level as to be virtually insignificant and has no effect at all as a factor in alignment errors. Accordingly, as a X-ray exposure mask requiring high precision alignment it is possible to realize a high performance X-ray mask provided with second alignment pattern having sufficiently high optical characteristics.

The X-ray mask of the subject invention, by forming the second alignment pattern for the mask on the other surface of the X-ray permeable film through equimultiple transfer using the first alignment patterns for the mask and substrate and the self-adjustment method, can obtain a sufficiently strong alignment signal. And, it offers great improvement in alignment accuracy and it also results in superior alignment accuracy and it also results in superior industrial productivity.

Also, since the second alignment pattern are also formed on the laser beam source side with a height which increases the diffraction efficiency, a sufficiently strong alignment signal is obtained.

Furthermore by using the X-ray mask of the subject invention to expose to the semiconductor wafer the circuitry pattern formed over the mask, there will be virtually no positional slippage between the mask and the wafer so that the desired circuitry pattern can also be easily exposed.

What is claimed is:

1. An X-ray mask comprising:
   an X-ray permeable film, having a first main surface and a second main surface opposite to said first main surface, supported by a supporting frame formed of silicon;
   an LSI circuit pattern and a first alignment pattern formed on the first main surface of said X-ray permeable film; and
   a second alignment pattern, substantially identical to said first alignment pattern, formed on the second main surface of said X-ray permeable film at a position corresponding to said first alignment pattern.

2. A fabricating method of an X-ray mask having a first main surface and a second main surface comprising the steps of:
   coating a photosensitive material over the second main surface of an X-ray permeable film being installed on a supporting frame and having a first LSI circuit pattern and a first alignment pattern formed on the first main surface; and
   forming a second alignment pattern opposite to said first main surface and self-adjustingly on the second main surface of said X-ray permeable film through an exposure of said photosensitive material from the first main surface of said X-ray permeable film with the first alignment pattern, which was formed on said first main surface, used as a mask and then a development of said photosensitive material.

3. A fabricating method of an X-ray mask having a first main surface and a second main surface comprising the steps of:
   coating a photosensitive material over the second main surface of an X-ray permeable film being installed on a supporting frame and having a first LSI circuit pattern and a first alignment pattern formed on the first main surface;
   forming a second LSI pattern and a second alignment pattern opposite to said first main surface and self-adjustingly on the second main surface of said X-ray permeable film through an exposure of said photosensitive material from the first main surface with the LSI circuit pattern and the first alignment pattern, which was formed on the first main surface, used as a mask and then a development of said photosensitive material; and
   eliminating selectively the second LSI circuit pattern formed on the second main surface of said X-ray permeable film.

4. An exposure method comprising the steps of:
   disposing an X-ray mask, which has an X-ray permeable film with an LSI circuit pattern and a first alignment pattern formed on a first main surface and also with a second alignment pattern formed on a second main surface opposite to said first main surface at a position corresponding to that of said first alignment pattern, close to a wafer surface with the first main surface of said X-ray permeable film facing said wafer surface; and
   irradiating the second main surface of said X-ray permeable film with X-rays after an alignment has been performed at least through the use of diffracted lights emitted from the second alignment pattern formed on the second main surface of said X-ray permeable film upon irradiating the second main surface of said X-ray permeable film with laser beam.

* * * * *